United States Patent
Vanden Brande

(10) Patent No.: US 9,222,162 B2
(45) Date of Patent: Dec. 29, 2015

(54) METHOD AND SYSTEM FOR GALVANIZING BY PLASMA EVAPORATION

(75) Inventor: Pierre Vanden Brande, Löhningen (CH)

(73) Assignee: ADVANCED GALVANISATION AG, Neuhausen (CH)

( * ) Notice: Subject to any disclaimer, the term of this patent is extended or adjusted under 35 U.S.C. 154(b) by 541 days.

(21) Appl. No.: 12/743,627

(22) PCT Filed: Nov. 7, 2008

(86) PCT No.: PCT/EP2008/065168
§ 371 (c)(1),
(2), (4) Date: May 19, 2010

(87) PCT Pub. No.: WO2009/065745
PCT Pub. Date: May 28, 2009

(65) Prior Publication Data
US 2010/0272918 A1    Oct. 28, 2010

(30) Foreign Application Priority Data
Nov. 19, 2007   (BE) .................................. 2007/0556

(51) Int. Cl.
| | | |
|---|---|---|
| H05H 1/00 | (2006.01) | |
| C23C 2/36 | (2006.01) | |
| C23C 2/00 | (2006.01) | |
| C23C 14/32 | (2006.01) | |
| C23C 14/54 | (2006.01) | |
| C23C 14/56 | (2006.01) | |

(52) U.S. Cl.
CPC . *C23C 2/36* (2013.01); *C23C 2/003* (2013.01); *C23C 14/32* (2013.01); *C23C 14/54* (2013.01); *C23C 14/562* (2013.01)

(58) Field of Classification Search
CPC .......... C23C 2/26; C23C 2/405; C23C 14/54; C23C 14/542; C23C 14/0036; C23C 14/3492
USPC .......... 118/50, 50.1, 729, 733, 620, 668, 675, 118/676, 679, 708; 204/192.1, 192.12, 204/192.13, 192.38; 427/294, 295, 569, 427/570, 576, 535
See application file for complete search history.

(56) References Cited

U.S. PATENT DOCUMENTS

| | | | | |
|---|---|---|---|---|
| 3,860,444 | A | * | 1/1975 | Donckel et al. ............... 427/566 |
| 5,651,867 | A | * | 7/1997 | Kokaku et al. ........... 204/298.25 |
| 5,851,688 | A | * | 12/1998 | Chen et al. ................... 428/32.1 |
| 6,171,659 | B1 | * | 1/2001 | Vanden Brande et al. .... 427/523 |
| 6,432,281 | B2 | * | 8/2002 | Vanden Brande et al. ........................ 204/192.15 |
| 6,572,738 | B1 | * | 6/2003 | Zueger ..................... 204/192.13 |
| 6,682,828 | B2 | * | 1/2004 | Chaleix et al. ................ 428/659 |
| 7,156,960 | B2 | * | 1/2007 | Vanden Brande et al. ........................ 204/192.12 |
| 2001/0032782 | A1 | | 10/2001 | Vanden Brande |
| 2002/0046943 | A1 | | 4/2002 | Echizen et al. |

* cited by examiner

*Primary Examiner* — Michael Wieczorek
(74) *Attorney, Agent, or Firm* — Browdy and Neimark, PLLC

(57) ABSTRACT

The invention relates to a method and a system for the plasma treatment of successive substrates comprising one or more steel products in which the substrates are transported, one after another, through at least one plasma treatment zone, characterized in that the electric power for generating the plasma in the treatment zone is varied according to the area of the substrate is present in this treatment zone when the substrate is running through this zone.

10 Claims, 2 Drawing Sheets

METHOD AND SYSTEM FOR GALVANIZING BY PLASMA EVAPORATION

1. GENERAL DESCRIPTION OF THE INVENTION

The invention relates to a method and plant for the plasma galvanisation of steel substrates in the form of sheets, girders, plates and profiles, with all types of cross section, but also parts disposed on supports, for example hooks or metal baskets, transported in a treatment zone by means of devices generally of any type such as a bank of rollers, or a monorail transport system.

In this method, the substrate to be treated, after having previously been decontaminated by known techniques of alkali degreasing and acid cleaning, followed by rinsing and drying, or decontaminated by mechanical abrasion, for example by means of a shot blasting machine, is introduced into a plasma galvanisation plant, the subject matter of the invention and functioning at a gas pressure below atmospheric pressure. In general the system functions under argon at a pressure of between 0.0005 and 0.05 mbar (0.05-5 Pa).

The plant preferably consists of a vacuum airlock for introducing and possibly also taking out the substrates to be treated, followed by vacuum treatment tanks, and terminating in a vacuum airlock for taking out the galvanised substrates, or a storage tank when the substrates enter and leave through the vacuum airlock for introducing the parts to be treated. In the latter case, the substrate moves first of all in one direction and then in the opposite direction within the plant in order to return to the vacuum airlock of the latter.

The use of one or two vacuum airlocks for introducing and taking out the substrates makes it possible to maintain the area where the treatment takes place constantly free from air, which is a fundamental point in the correct functioning of this method, in particular for avoiding the presence of any oxidised interface between the steel and the zinc and thus ensuring optimum adhesion of the zinc coating to the steel.

The plant according to the invention comprises one or more sections for activation of the steel surface by ion bombardment erosion. Various devices can be envisaged for performing this treatment. For example, a device for magnetron etching of the steel using magnetic mirrors for confinement of the discharge around the substrate to be treated as described in the document WO 02/12591, or an inductive plasma source coupled to an acceleration of the ions produced by a DC generator by biasing the substrate negatively with respect to an anode facing it, or the use of ion guns. In all cases, it is necessary to be able to control the power of the etching device according to the area of the steel substrate passing per unit of time through this device, in particular cutting the supply to the plasma activation source for the steel substrate when the latter is not present in the treatment zone. This is because in this case, apart from the unnecessary use of energy, there is a risk of damaging the plant by heating its walls. Conversely, it is necessary to be able to trigger and progressively increase the power of the plasma activation source when a substrate enters this treatment zone.

The plant also comprises one or more zinc plasma evaporation galvanisation sections. This method, already known and described in the document WO 02/16664, uses a retention vessel for maintaining a certain quantity of zinc in the liquid state and evaporating it by means of a plasma produced in the zinc vapour by biasing the liquid zinc on average negatively with respect to a counter-electrode that constitutes an anode. The retention vessel is supplied with liquid zinc via a feed tube immersed in a reserve of zinc maintained in a vacuum furnace situated in a vacuum chamber, isolated from any passage of gas to the galvanisation vacuum vessel and in which, by regulating the gas pressure, it is possible to regulate the level of the liquid zinc in the retention vessel situated in the vacuum tank where the galvanisation takes place. The plasma produced in the zinc vapour is generally obtained by means of a magnetron discharge. The zinc vapour tension above the retention vessel depends on the electrical power dissipated on the surface of the liquid zinc and fixes the weight of zinc that it is possible to deposit per unit of time on the steel substrate. This vapour tension may attain several mbar corresponding generally to a mass of zinc evaporated of several kg/min. it is therefore essential, as already described in the document WO 02/16664, to provide a confinement chamber with heated walls to prevent the zinc vapour for contaminating the whole of the plant by condensing on all the cold surfaces, which are generally at ambient temperature, other than the substrate. Entry and exit openings are provided in this confinement chamber in order to enable the substrate to be coated to trespass through it. The zinc coating is therefore obtained by condensation of the zinc vapour directly in the solid state on the cold surface of the substrate passing through the confinement chamber. The temperature of the surface of the substrate is typically less than 150° C.

It is therefore advantageous to be able to adapt the electrical power delivered to the plasma and dissipated, via bombardment by ions issuing from the plasma, on the surface of the liquid zinc in the retention vessel according to the area of the steel substrate passing per unit of time in the confinement chamber. In particular, according to the invention, this electrical supply is cut when no substrate is present in the confinement chamber and, conversely, the electrical power dissipated on the surface of the liquid zinc is triggered and increased progressively when the substrate enters the confinement chamber. This is done so as not only to ensure a uniform thickness of zinc on the surface of the substrate but particularly to limit the losses of zinc through the entry and exit openings of the confinement chamber when no substrate is passing through the confinement chamber. This is because, apart from the economic waste of zinc and energy, the zinc contamination may seriously damage the galvanisation plant by plasma evaporation if it is not controlled.

The result of the above is that the treatment devices of the plant have an advantage to function in an identical sequence when the substrate is passing through one of the treatment devices comprising:
  powering up of the treatment device when the substrate enters therein;
  increase in the power supplied to the treatment device proportionally to the area of the substrate passing through the treatment device until the nominal operating power of the method is reached when the substrate passes completely through the treatment device;
  maintenance of a constant nominal treatment power dependent on the speed of passage of the substrate, as long as the substrate is passing through the treatment device from end to end;
  reduction in the power supplied to the treatment device proportionally to the area of the substrate in the device when the substrate emerges from the device and is no longer passing right through;
  cutting the electrical supply supplying the treatment device in the absence of a substrate.

This sequence of start-up, maintenance in operating regime and then stoppage of each treatment device during passage of the substrate to be treated, in the plasma evaporation galvanisation plant, prevents contamination and saves on energy for the plant, according to the invention.

For reasons of flexibility of functioning of the plant, it is possible to use the substrate to be treated as a trigger for the various treatment units if at least one presence detector is situated at the entry and at least one detector is situated at the exit of each treatment device. The plant according to the invention therefore comprises a detector at the entry and at the exit of each treatment device, that is to say upstream and downstream with respect to the direction of passage of the substrate of each plasma or etching activation unit and each confinement chamber corresponding to a plasma evaporation galvanisation unit.

The substrates to be treated, or the products that constitute these substrates, having through the nature of the application essentially variable lengths and cross sections, may be disposed with more or less precision at the entry to the installation as soon as an entry airlock is released. It is necessary to provide a system for regulating the advance of the substrates in the plant, as well as a system for regulating the functioning of the various treatment devices of the plant slaved to the advance of the substrates. This is in order to avoid the problems already mentioned above such as for example contamination and loss of energy but also the purpose of giving a maximum flexibility to the treatment of substrates with different geometries under optimum operational conditions. This regulation is independent of the mode of transport of the substrates to be treated, for example long substrates transported on rollers or suspended between hooks and transported by a monorail travel system, or parts disposed in baskets transported on a monorail through the various treatment devices.

The invention therefore relates to the independent functioning of each treatment device slaved to the detection of the advance of the substrates treated by the detector situated upstream and downstream of each of these processing devices.

The independent management of the various treatment devices, triggered and stopped when a substrate passes, can advantageously be implemented by the following hierarchical management of the plant:

A master program enabling the plant to be put under working conditions, to be opened to atmosphere again for maintenance, and, in operation, enabling the vacuum airlocks and the movement of the steel substrates to be controlled, at a transport speed, for rapid introduction and discharge thereof from the vacuum airlock or airlocks of the plant, and at a generally lower treatment speed during the treatment of the substrates in the various treatment devices of the plant.

One slave program per treatment device activated by at least two detectors with the presence of a substrate, one situated at the entry to the treatment device and the other situated at the exit from the treatment device. The slave programs being slaved to a signal transmitted by the master program when the physical conditions required for the functioning of the processes are reached. In practice, this master signal is obtained when the treatment section of the plant reaches the nominal argon pressure throughout, which is typically between 0.0005 and 0.05 mbar. Each slave program is characterised by a similar sequence of control of the electrical power supplied, as already mentioned previously; startup, power increase ramp up to operating regime, maintenance of operating regime as long as a substrate is detected by the entry and exit detectors, reduction ramp for the power coupled to the device, and cutting of power when a substrate is no longer detected by the two detectors.

This hierarchical structure for the control of the plasma evaporation galvanisation plant constitutes a particular aspect of the use of the installation according to the invention.

The great advantage this hierarchical control of the galvanisation plant for which each treatment device is started and stopped independently by a slave program when the passage of the substrate through this treatment device is detected, is that it is possible to reduce the unproductive waiting times during which the substrates enter and leave the installation through its entry and exit vacuum airlock or airlocks without modification to the plant control software, simply by increasing the vacuum pumping capacity of the entry and/or exit vacuum airlock, as well as the speed of transport from a loading area to the airlock, or conversely from the vacuum airlock to the discharge area.

When the transportation of the substrate in the course of processing is controlled by the master program, it is therefore necessary to use a speed of transport of the substrate for moving the substrate from the loading area to a vacuum airlock, or from a vacuum airlock to the discharge area, which is as high as possible and therefore at least greater than the treatment speed used when the substrates pass through the various treatment devices of the plant.

2. DESCRIPTION OF THE FIGURES

Other details and particularities of the invention will emerge from the description given below by way of non-limitative example of a particular embodiment of the plant and of the method according to the invention with reference to the accompanying drawings.

In the various figures, the same reference signs relate to similar or identical elements.

3. DETAILED DESCRIPTION OF THE INVENTION

Figure 1:
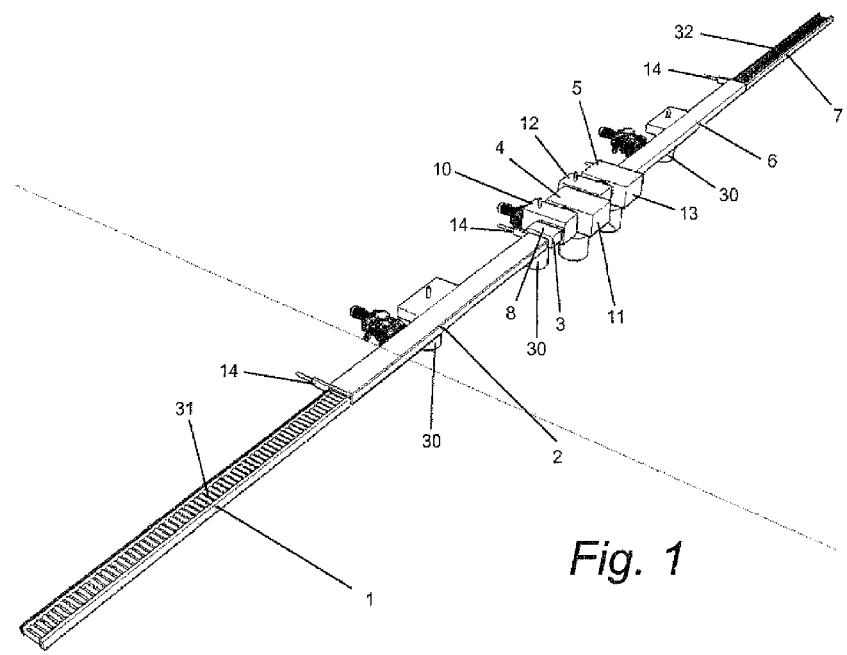
FIG. 1 is a schematic representation of a plasma evaporation galvanisation line for steel substrates according to the invention.

The plant according to the invention comprises a batch plasma evaporation galvanisation line and is composed essentially, as shown in FIG. 1, of:

a zone 1 for introducing the substrates which may, as shown in FIG. 1, consist of a bank of rollers for introducing long substrates such as steel girders. The substrate transport system is a system for transportation by banks of motorised rollers. Naturally other transport systems can be envisaged, such as a monorail transport system for suspending the substrates and transporting them from the zone 1 to the various other zones of the plant;

an entry vacuum airlock 2 that makes it possible to keep an adjacent treatment zone 3 continuously under vacuum at the required argon pressure and thus avoids contaminating the treatment zone by the introduction of air. The argon pressure required is typically between 0.05 and 5 Pa.

several treatment zones comprising a zone 3 for plasma activation of the substrate and two plasma galvanisation zones 4 and 5. The zones 4 and 5 being continuously maintained, in operating mode, under partial argon pressure, preferably between $5\times10^{-4}$ and $5\times10^{-2}$ mbar;

an exit airlock 6 for discharging the substrates from the treatment zones 3, 4 and 5 to an exit and discharge zone 3 while maintaining these zones free from air.

In an alternative embodiment of the plant according to the invention, the entry vacuum airlock 2 also serves as an exit vacuum airlock when the substrate, after having fully entered the treatment zones 3, 4 and 5, returns to the entry airlock 2 by reversal of the direction of movement of the transport system. In this case, a vacuum storage vessel can be provided at the exit vacuum airlock 6 in FIG. 1.

It is obvious that, when the treatment of the substrates takes place in one direction, from the introduction zone 1 towards the treatment zones 3, 4 and 5, and next in the other direction, from these treatment zones 3, 4 and 5 towards the introduction zone 1, the exit zone 7 for discharging the substrates is unnecessary, which also makes it possible, apart from the saving on an airlock and this substrate transport zone, to produce a plant with a shorter length.

Figure 2:
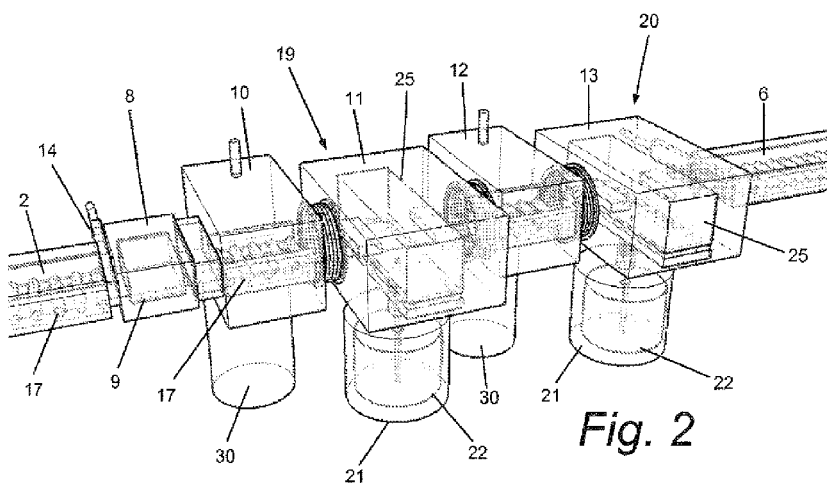
FIG. 2 is a schematic representation of an example of a part of the plant, according to the invention, comprising three plasma treatment devices.

FIG. 2 shows a typical example of treatment elements used in a plasma galvanisation plant. The treatment zones are composed of the following successive elements:

A vessel 8 equipped with a device 9 for the plasma activation of the steel surface. The substrate, which is not shown in the figure, passes through this vessel 8 in free suspension.

A vessel 10 for high-vacuum pumping and transportation of the substrate. This vessel 10 making it possible to maintain the argon working pressure in the adjoining activation 8 and zinc plating 11 vessels. This vessel 10 also makes it possible to support and move forward the substrates that pass through it on motorised rollers.

A plasma zinc-plating vessel 11 for galvanising the steel substrates after plasma activation thereof in the activation vessel 8.

A second high-vacuum pumping vessel 12 for transportation of the substrate.

A second plasma zinc-plating vessel 13 for galvanising the steel substrates.

Figure 3:
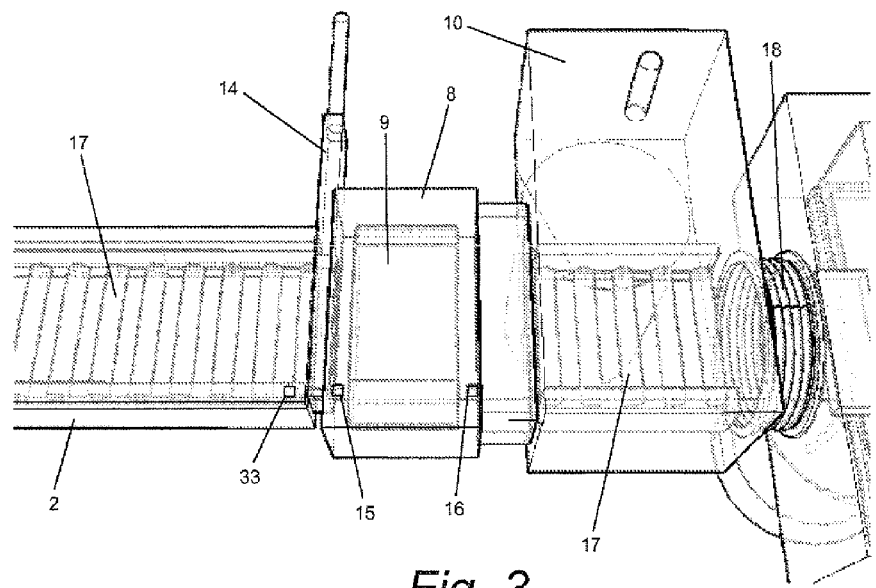
FIG. 3 shows a typical arrangement comprising a device having a vacuum tank with an ion source and a transport tank.

The entry vacuum airlock 2 is separated from the activation vessel 8 by an airtight door 14 isolating all the treatment zones 3, 4 and 5 from this vacuum airlock 2, as illustrated in more detail in FIG. 3. The substrate is introduced from the introduction zone 1 via the entry vacuum airlock 2, after opening of the airtight door 14, in the activation vessel 8 comprising the plasma activation device 9. The device 9, initially not powered, is activated as soon as the substrate is detected by a detector 15 that is mounted at the entry to the activation vessel 8. At the exit from this activation vessel, a second detector 16 for the substrate is provided.

The electrical power applied to the plasma activation device 9 is increased progressively, proportionally to the length of the substrate passing through the space between the two detectors 15 and 16 until it reaches the nominal operating power when the two detectors 15 and 16 are activated by the presence of the substrate in the activation vessel 8. As soon as the entry detector 15 is no longer activated, the power supplied to the activation device 9 is decreased proportionally to the length of the substrate remaining between the two detectors 15 and 16, until the electrical power is cut off when the substrate is no longer detected either by the entry substrate or by the exit detector 16.

In this particular configuration of the plasma galvanisation plant, the substrate is transported on beds of motorised rollers 17 situated in the entry vacuum airlock 2 and in the transport and high-vacuum pumping vessels 10 and 12. It is obvious that other transport means such as for example a monorail, passing right through the entry vacuum airlock 2, the activation vessel 8 and the transport and pumping vessel 10, making it possible to suspend the substrates to be treated and enabling the activation device 9 to be adapted geometrically to the passage of the loads to be treated, would have made it possible to fulfil the same function as the tables with beds of motorised rollers 17 and that this transport means has no effect on the regulation of the device for plasma activation of the substrates 9 via the entry 15 and exit detectors 16 for the substrate upstream and downstream of the plasma activation device 9 in the vacuum vessel 8.

After the surface of the substrate has been activated in the activation device 9, the substrate is directed to the roller-bed table 17 in the transport and pumping vessel 10 towards the first plasma galvanisation vessel 11, where it is suspended free, and then is once again supported and transported by a roller-bed table 17 in the transport and pumping vessel 12 before passing in free suspension through the second plasma galvanisation vessel 13.

The airtight connection designed for high vacuum between the transport vessels 10 and 12 and the plasma galvanisation vessels 11 and 13, enabling the substrate to be galvanised to pass from one vessel to the other, is provided by means of a flexible tube 18. Preferably these flexible connections 18 are secured to transport and pumping vessels 10 and 12 and clamped against the flanges machined on the galvanisation vessels 11 and 13 by jacks, not shown. The advantage of this particular configuration is to allow the use of a galvanisation vessel 11 and 13 consisting of a table on which the top part of the vessel in the form of a bell is disposed, which, in a maintenance period, can be completely removed or raised, thus affording maximum access to the equipment disposed inside the corresponding vessel.

The galvanisation vessels 11 and 13 form part of a corresponding galvanisation device 19 and respectively 20. These galvanisation treatment devices 19 and 20 comprise respectively:

a vacuum vessel 21 containing a furnace 22 for maintaining in the molten state and regulating for temperature a reserve of liquid zinc for supplying a crucible 23 situated in the corresponding galvanisation vessel 11 or 13. The connection between the vacuum vessels 21 and corresponding galvanisation vessels 11 or 13 is provided exclusively and respectively by means of a supply tube 24. This tube 24 is gastight and must make it possible to maintain a constant argon pressure in the galvanisation vessel 11 or 13 typically between $5\times10^{-4}$ and $5\times10^{-2}$ mbar, whereas the argon or nitrogen gas pressure in the vacuum vessel 21 containing the furnace 22 may typically vary between 0.1 and 2000 mbar. This is essential in order to make it possible to empty or feed the crucible 23 provided in the corresponding galvanisation vessel 11 or 13 with liquid zinc respectively by decreasing or increasing the gas pressure in the vacuum vessel 21 containing the furnace 22.

said galvanisation vacuum vessel 11 or 13 containing the plasma galvanisation equipment consisting of said crucible 23 surmounted by a zinc vapour confinement chamber 25 confining the zinc vapour close to the substrate to be galvanised passing through it. The walls of the confinement 25 are generally heated by conventional means by Joule effect so that the zinc cannot condense thereon either in solid form or liquid form. In general the internal temperature of the walls of the confinement chamber 25 is between 400° and 500° C. The confinement chamber 25 has an entry opening 26 and an exit opening 27. In the vicinity of each opening 26 and 27 of the confinement chamber 25, and inside the galvanisation vessel 11 or 13 respectively, a substrate presence detector 28 and 29 is provided making it possible to regulate the electrical power coupled to the plasma serving for the evaporation of the zinc, when the substrate passes in accordance with the scheme already disclosed above. The electrically conductive crucible 23, generally made from high-density graphite, is supplied with liquid zinc by means of the tube 24 via a regulation of the gas pressure in the vacuum vessel 21. The crucible 23 is on average biased negatively with respect to an anode (not shown) situated inside the confinement chamber 25. Generally a magnetic circuit is provided situated below the crucible 23 and making it possible to effect a magnetron discharge in the zinc vapour produced by dissipation of the energy of the plasma on the surface of the liquid zinc contained in the crucible 23. During treatment of a substrate, when only the substrate entry detector 28 is activated, the electrical power applied to the plasma is increased progressively, proportionally to the length of the substrate passing through the space between the two detectors 28 and 29 until it reaches the nominal operating power when the two detectors 28 and 29 are activated by the presence of the substrate. As soon as the substrate entry detector 28 is no longer activated but the exit detector 29 is still activated, the power supplied to the plasma serving for the evaporation of the zinc is decreased proportionally to the length of the substrate remaining between the two detectors 28 and 29, until the electrical power is cut off when the substrate is no longer detected by one or other of the detectors situated in the vicinity of the substrate entry and exit openings of the confinement chamber 25. The term entry detector 28 upstream of the chamber 25, or exit detector 29 downstream of the chamber 25, depends solely on the position of the detector with respect to the direction of travel of the substrate. As a result, though the detectors 28 and 29 have an absolute entry or exit character in a plant functioning in a single direction, this is not the case with a plant having only one airlock and therefore functioning first of all in one direction and then in the other. In this case an entry detector in one direction of travel of the substrate becomes an exit detector in the opposite direction and vice versa.

When the substrate consists of a metal sheet, the entry detectors 15 and 28 and the exit detectors 16 and 29 can also measure the width of the sheet in order for example to determine the area of the sheet that is present in the treatment zone concerned.

4. OPERATIONAL CONDITIONS AND PARTICULAR CONFIGURATIONS OF THE INVENTION a) Control of the Gas Pressure During Treatment

A master program controls the opening and closing of the airtight doors 14, as well as the switching on and off of the vacuum pumps 30 connected to the respective vacuum vessels, in order to maintain a constant gas pressure in the treatment zones 3, 4, and 5 of the installation by isolating these zones by means of the airtight doors 14 of the entry 2 and exit 6 airlocks when these airlocks 2 and 6 are not at a pressure below the argon pressure prevailing in the treatment zones 3, 4 and 5. Generally, argon is present in these zones at a pressure between 0.05 and 5 Pa, preferable around 0.5 Pa.

b) Travel System During Production

The travel system is characterised by the existence of two different speed ranges, a transport speed that is a rapid advance speed for the entries and exits of the vacuum airlocks 2 and 6 and a treatment speed, which is slower, for galvanisation. This is essential to ensure sufficient productivity by limiting the entry and exit times of the substrates in the vacuum airlocks. The transport speed is higher than the treatment speed in order to limit transient effects. Generally the treatment speed is below 30 m/min and the transport speed is higher than 20 m/min/

The advance of the substrates is controlled by substrate presence detectors situated on the path traveled by the substrates during a complete treatment cycle and controlled by the master program. There is at least one substrate presence detector upstream and downstream of each vacuumtight door 14 enabling the substrate to pass, and at least one substrate presence detector upstream 15, respectively 28, and downstream 16, respectively 29, of each item of treatment equipment in the zones 3, 4 and 5. Monitoring the signals transmitted by the upstream and downstream detectors with respect an airtight door 14 or an item of processing equipment makes it possible to determine the start and end of the passage of a substrate.

The advance of the substrates controlled by the master program is dependent on the opening of the airtight isolation doors 14 between the entry 2 and exit 6 airlocks and the treatment zones 3, 4 and 5, itself dependent on a measurement of the gas pressure prevailing in these treatment zones 3, 4 and 5 of the plant.

c) Slaving of the Treatment Equipment

Each item of treatment equipment is slaved to the advance of a substrate through the detection of the substrate by at least one substrate presence detector situated upstream 15 and respectively 28, and at least one substrate presence detector situated downstream 16 and respectively 29 of the plasma treatment devices.

d) Control of the Treatment Equipment

Figure 4:
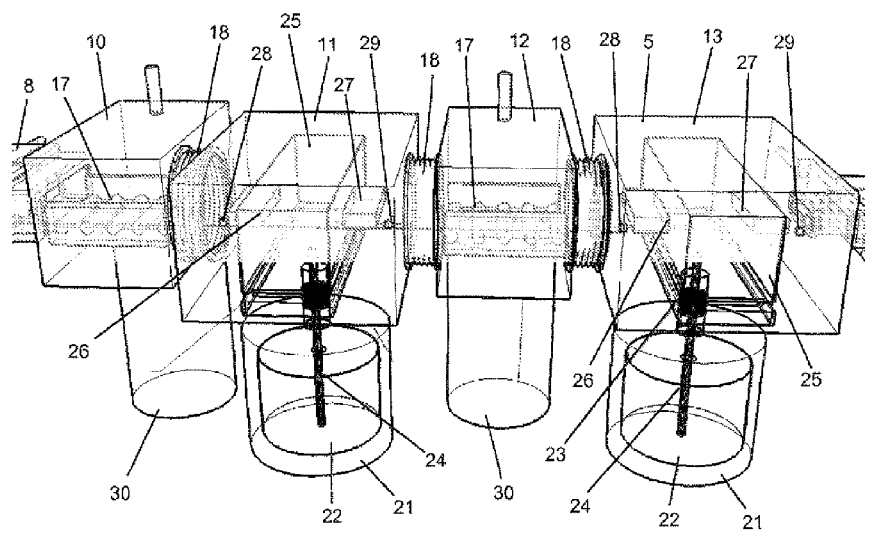
FIG. 4 shows two galvanisation devices, each of these devices being preceded by a transport and pumping tank.

Each treatment device 9, 19 and 20 is controlled by a slave program specific to this treatment device controlling its triggering, the increase, maintenance and reduction of the electrical power coupled to the plasma supplied for the treatment, and finally its switching off according to the signals transmitted by the detector situated upstream and downstream of said device. The power coupled to the plasma increases proportionally to the area of the substrate situated between the entry, upstream, and exit, downstream, detectors, when only the entry detector 15 or respectively 28 is activated. The power coupled to the plasma is nominal when the two detectors 15 and 16 or respectively 28 and 29 are activated by the substrate. The power coupled to the plasma decreases proportionally to the area of the substrate situated between the two detectors when only the exit detector 16 or respectively 29, downstream with respect to the travel of the substrate, is activated. The substrate presence detectors can function according to any principle, whether it be mechanical, magnetic, electrical or optical.

e) Specific Functions of the Slave Program for Controlling a Plasma Galvanisation Unit Referring to FIG. 4 and considering the plasma galvanisation device 19 or 20, the slave program for controlling a plasma galvanisation device 19 or 20 comprises the following functions.

control by any means, such as for example by weighing, electrical contact or optical measurement, and maintenance of the level of liquid zinc in the crucible 23 via the supply tube 24 emerging in the bottom of the crucible 23, by acting on the gas pressure in the vacuum vessel 21 containing the furnace 22 storing a reserve of liquid zinc;

maintenance of the internal walls of the confinement chamber 25 at a minimal constant temperature, which is typically between 400° and 500° C., in order to prevent therein any condensation of zinc in liquid or solid form;

control of the power coupled to the plasma formed in the zinc vapour via the electrical supply connected to the crucible 23 provided by the entry 28 and exit 29 detectors in the following manner:

as long as the entry 28 and exit 29 detectors are not activated the electrical supply does not deliver any power in order to generate the plasma in the confinement chamber 25 or, more generally, delivers a minimal power;

when the entry detector 28 is activated by the presence of the substrate, the power coupled to the plasma and provided by the electrical supply is increased proportionally to the area of the substrate contained in the confinement chamber 25 in order to reach constant nominal power delivered by the supply when the entry detector 28 and the corresponding exit detector 29 are activated;

when the entry detector ceases to be activated by the substrate, the power coupled to the plasma is decreased progressively proportionally to the area of the substrate contained in the confinement chamber 25;

when the entry 28 and exit 29 detectors are both inactive, the supply no longer delivers any power or more generally delivers minimal power.

In the case where the substrate moves from the second galvanisation device 20 to the first galvanisation device 19, the process would be reversed with respect to the two detectors 28 and 29 since, in this case, the entry detector 28 would become the exit detector and the exit detector 29 would become the entry detector with respect to the plasma galvanisation device.

5. EXAMPLE OF PRACTICAL APPLICATION

A plant as shown in FIGS. 1 to 4 enables long steel substrates to be plasma zinc plated. This plant comprises a substrate loading table 31 in the introduction zone 1, an entry vacuum airlock 2, zones 3, 4 and 5 for treating the substrates, always maintained at 0.005 mbar of argon, an exit vacuum airlock 6, and a table 32 for discharging the substrates in the exit zone 7.

The treatment zone situated between the two entry 2 and exit 6 vacuum airlocks for the substrates into and from the plant comprises a treatment zone 3 for activating the surface of the steel substrates by ion bombardment, eliminating any surface oxide or contamination in order to afford good adhesion of the zinc deposit. This treatment zone 3 is followed by a transport and high-vacuum pumping vessel 10 provided with a diffusion pump 30, a first plasma galvanisation vessel 11, a second transport and pumping vessel 12, and finally a second plasma galvanisation vessel 13. The latter is connected with the exit vacuum airlock 6 through an airtight door 14. The treatment zones are in particular isolated from the entry 2 and exit 6 vacuum airlocks by airtight doors 14 when the residual air pressure prevailing in the vacuum airlocks 2 or 6 is greater than $10^{-4}$ mbar. The transport system consists of banks of motorised rollers 17, and the substrates are transported through the plant from the introduction zone 1 towards the exit zone 7.

The plant is designed to treat long substrates such as concrete bars and girders 12 m long at a maximum deposited in bulk on the loading table 1. Thus the substrate consists of several products extending alongside one another. The weight of steel that can be galvanised per batch is typically between 500 kg and 1300 kg according to the geometry of the substrates treated and the thickness of the zinc layer sought.

The treatment wequence comprises the following steps
loading of the substrate onto the loading table 31;
isolation of the treatment zones 3, 4 and 5 from the entry vacuum airlock 2 by closing the airtight door 14;
opening the entry vacuum airlock 2 to atmosphere again;
opening the external airtight door 14 of the entry airlock 2 adjacent to the entry zone 1;
introducing the substrates at the transport speed of 60 m/min as far as the bottom of the entry vacuum airlock 2, stopping the bed of rollers 17 by detecting the load head at the end of the entry airlock 2 by means of a load presence detector 33;
closing the external airtight door 14 of the entry vacuum airlock 2;
putting the entry vacuum airlock 2 under high vacuum;
opening the intermediate airtight door 14 between the entry vacuum airlock 2 and the first treatment zone 3;
advancing the load to be treated at its treatment speed of 9 m/min;
plasma activation treatment of the surface in the first treatment zone 3 activated by the entry 15 and exit 16 detectors;
plasma evaporation galvanisation treatment in the galvanisation device 19 activated by the entry 28 and exit 29 detectors;
plasma evaporation galvanisation treatment in the second galvanisation device 20 activated by the corresponding entry 28 and exit 29 detectors;
when the substrate is detected at the end of the exit vacuum airlock 6, the airtight door 14 between the second galvanisation device 20 and this exit vacuum airlock 6 is closed again;
opening the exit vacuum airlock 6 to atmosphere again;
when atmospheric pressure is reached in the exit vacuum airlock 6, the external airtight door of this airlock 6 opens;
bringing the substrate out of the exit vacuum airlock 6 at the transport speed of 60 m/min until the end of the discharge table 32 is detected in the discharge zone 7;
discharging the substrate from the discharge table 32;
closing the external airtight door 14 of the exit vacuum airlock 6;
putting the exit vacuum airlock 6 under high vacuum;
opening the internal airtight door 14 between the exit vacuum airlock 6 and the second galvanisation device 20.

At a transport speed of 60 m/min the time taken to introduce the substrate to be treated into the entry vacuum airlock 2, or the exit time for the substrate to the discharge table 32, from the exit vacuum airlock 6, is around 12 seconds only, whereas the time for release of the entry vacuum airlock 2 at the treatment speed of 9 m/s is around 80 seconds. In this plant, the time for a new cycle in the entry vacuum airlock 2 is 4 min, as against 3.41 min for a new cycle in the exit vacuum airlock 6. It is therefore the longer time, corresponding to the time of the operating cycle of the entry vacuum airlock 2, that limits the productivity of this plant to approximately 19 tonnes per hour.

This practical example shows the advantages of working with the highest possible transport speed in order to reduce the waiting times and increase the productivity of the plant.

The loading table 31 can be loaded as soon as released. When no load is detected in the entry vacuum airlock 2, the latter is isolated and put to atmospheric pressure again. The same principle being applied for the exit vacuum airlock 6, and entry and exit detectors upstream and downstream of each treatment unit enabling, via a slave program, control of the electrical power necessary for the process, the system can function between its maximum production determined by the time for releasing the entry vacuum airlock 2 and a lower production limited by the loading of the table 31 without requiring centralised control of all the movements and processes of the installation because the management of the processes depends on the detection of the substrates upstream and downstream of the various treatment devices of the plant.

The master program, once the plant is ready for production, when the nominal argon pressure of 0.005 mbar is reached in the treatment zones 3, 4 and 5 and the crucibles 23 of the two plasma galvanisation units 19 and 20 are supplied with liquid zinc, controls the passage of the substrates to be treated from the loading table 31 to the discharge table 32 as quickly as possible while providing the sequences of putting under vacuum and opening to atmosphere again of the entry 2 and exit 6 vacuum airlocks as well as the transportation of the substrates from the entry vacuum airlock 2 to the activation vessel 8 and from the galvanisation device 20 to the exit vacuum airlock 6 and between the treatment zones 3, 4 and 5 at the transport speed of 60 m/min and treatment speed of 9 m/min respectively.

The activation zone 3 comprises a device for plasma activation of the substrate that consists of an inductive plasma source, supplied by a radio-frequency (RF) generator, and an anode facing it, of accelerating the argon ions produced by the inductive source towards the surface of the substrate, by means of a direct current (DC) generator. The plasma activation device is controlled as the substrate passes by the entry 15 and exit 16 detectors via the following logic sequence when a pressure of $5\times10^{-3}$ mbar of argon is reached in the activation vessel 8:

```
IF ("detector 15" = ON AND "detector 16" = OFF) THEN
    RF power ON
    DC power ramp up
ELSE IF ("detector 15" = ON AND "detector 16" = ON) THEN
    RF power ON
    DC power to nominal value
ELSE IF ("detector 15" = OFF AND "detector 16" = ON) THEN
    RF power ON
    DC power ramp down
ELSE IF ("detector 15" = OFF AND "detector 16" = OFF) THEN
    DC power OFF
    RF power OFF
```

When an argon pressure of $5\times10^{-3}$ mbar is reached in the galvanisation vessel 11 of the galvanisation zone 4, the internal walls of the confinement chamber 25 are at 500° C., and in addition the crucible 23 is supplied with liquid zinc, the plasma zinc coating device 19 is controlled as the substrate passes by the entry 28 and exit 29 detectors via the following logic sequence:

```
IF ("detector 28" = ON AND "detector 29" = OFF) THEN
    "crucible 23" Zn level control
    Plasma power ramp up
ELSE IF ("detector 28" = ON AND "detector 29" = ON) THEN
    "crucible 23" Zn level control
    Plasma power to nominal value
ELSE IF ("detector 28" = OFF AND "detector 29" = ON) THEN
    "crucible 23" Zn level control
    Plasma power ramp down
ELSE IF ("detector 28" = OFF AND "detector 29" = OFF) THEN
    Plasma power to minimal value
```

It should be noted that "minimal value" may in certain cases mean the pure and simple cutting of the electrical supply. Everything depends on the power necessary for maintaining the temperature of the liquid zinc contained in the crucible 23 in order to prevent its solidifying. In general the power radiated by the hot walls of the confinement chamber 25 suffices and in this case the electrical supply can be cut off (plasma power OFF).

The invention claimed is:

1. A method for the plasma treatment of successive substrates, wherein each substrate comprises one or more steel products, comprising transporting the substrates one after the other through at least one plasma treatment zone (3,4,5), varying the electrical power supplied to generate the plasma in the treatment zone (3,4,5) progressively and proportionally according to the area of the substrate present in the treatment zone (3,4,5) while the substrate is entering the treatment zone and while the substrate is leaving the treatment zone when the substrate is passing through the treatment zone (3,4,5), wherein the substrates are moved along a straight path through the treatment zone.

2. The method according to claim 1, further comprising generating a plasma in the treatment zone (3,4,5) when the substrate enters the treatment zone and deactivating the plasma when the substrate has left the treatment zone (3,4,5).

3. The method according to claim 1, wherein the step of varying the electrical power comprises increasing the electrical power to generate a plasma in the treatment zone (3,4,5) proportionally to the area of the substrate entering the treatment zone (3,4,5) until a nominal operating power is reached when the substrate extends along the entire length of the treatment zone (3,4,5) in the direction of travel of the substrate.

4. The method according to claim 1, wherein the step of varying the electrical power comprises reducing the electrical power to generate the plasma proportionally to the area of the substrate present in the treatment zone (3,4,5) when the substrate leaves the treatment zone until a minimal operating power is reached or until the electrical supply to the plasma generated is cut when the substrate has completely left the treatment zone (3,4,5).

5. The method according to claim 1, further comprising detecting entry of a substrate into the treatment zone (3,4,5) and exit of said substrate from the treatment zone (3,4,5), generating signals indicative of the detected entry and exit of said substrate, and controlling the electrical power generating the plasma on the basis of detection of the substrate according to the area of the substrate present in the treatment zone (3,4,5).

6. The method according to claim 5, further comprising controlling the treatment of the substrates in the treatment zones (3,4,5) independently by a slave program on the basis of the signals generated by the detection of the entry of the substrate in the treatment zone (3,4,5) and by the detection of the exit of the substrate from the treatment zone (3,4,5), wherein said slave program is dependent on a signal sent by a master program when physical conditions required prior to creation of a plasma in the treatment zone (3,4,5) are achieved.

7. The method according to claim 1, wherein the step of transporting the substrates comprises transporting the substrates through a first treatment zone (3) in which the surface of the substrates is activated by ion bombardment, followed by transporting the substrates through at least a second treatment zone (4,5) in which the substrates are coated by zinc condensation evaporated by plasma on the surface of the substrates.

8. The method according to claim 7, further comprising, in the second treatment zone (4,5), delivering electrical power to the plasma and dissipating the electrical power, by bombardment of ions issuing from the plasma on the surface of liquid zinc present in the second treatment zone (4,5), according to the area of the substrate present in the second treatment zone when said substrate passes.

9. The method according to claim 1, wherein the step of transporting the substrates comprises transporting the substrates to the treatment zone (3,4,5) and from said treatment zone through an entry vacuum airlock (2) and an exit vacuum airlock (6).

10. The method according to claim 9, wherein the substrates are introduced into the entry vacuum airlock (2) and leave the exit vacuum airlock (6) at a transport speed that is determined according to a speed of treatment of the substrates in the treatment zone (3,4,5) and is greater than the treatment speed.

\* \* \* \* \*